(12) United States Patent
Minakata et al.

(10) Patent No.: US 6,504,197 B2
(45) Date of Patent: Jan. 7, 2003

(54) MAGNETIC MEMORY ELEMENT AND MAGNETIC MEMORY USING THE SAME

(75) Inventors: Ryoji Minakata, Nara (JP); Masashi Michijima, Kyoto-fu (JP); Hidekazu Hayashi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/810,862

(22) Filed: Mar. 16, 2001

(65) Prior Publication Data

US 2001/0022373 A1 Sep. 20, 2001

(30) Foreign Application Priority Data

Mar. 16, 2000 (JP) ......................................... 2000-073590

(51) Int. Cl.⁷ .............................................. H01L 29/72
(52) U.S. Cl. ........................... 257/295; 257/2; 257/421; 257/423; 257/425
(58) Field of Search .............................. 257/295, 421, 257/423, 425, 2

(56) References Cited

U.S. PATENT DOCUMENTS 5,962,905 A * 10/1999 Kamiguchi et al. ......... 257/421

OTHER PUBLICATIONS

Akinaga et al, American Institute of Physics, vol. 76, No. 3, Jan. 17, 2000, p. 357–359, "Room–temperature thousand-fold magnetoresistive change in MnSb granular films: Magnetoresistive switch wffect".*

"Zur transversalen magnetischen Wilderstandsanerung von InSb", Z. Phys., vol. 138 (1954), p. 322–329, Welker, with Partial English Translation thereof.

"Magneto–Tunneling In InSb", Phys. Rev. Lett., vol. 5 (1960), p. 55–57, A. R. Calawa.

"Room–temperature thousndfold magnetoresistance change in MnSb granular films: Magnetoresistance change in MnSb granular films: Magnetoresistive switch effect", Appl. Phys. Lett., vol. 76 (2000), p. 357, H. Akinaga.

* cited by examiner

Primary Examiner—Edward Wojciechowicz
(74) Attorney, Agent, or Firm—Edwards & Angell, LLP; David G. Conlin; Richard J. Roos

(57) ABSTRACT

A magnetic memory element has a first ferromagnetic layer, a second ferromagnetic layer, and a non-magnetic layer disposed between these ferromagnetic layers. The non-magnetic layer has an electrical characteristic that is changeable depending on an external magnetic field applied to the non-magnetic layer.

10 Claims, 3 Drawing Sheets

MAGNETIC MEMORY ELEMENT AND MAGNETIC MEMORY USING THE SAME

BACKGROUND OF THE INVENTION

The present invention generally relates to a magnetic memory element suitably usable in a high-density magnetic memory such as magnetic random access memory (MRAM).

Recently, the application of magnetic tunnel junction (MTJ) elements to playback magnetic heads for hard disk drives (HDDs) and to magnetic memories has been considered and discussed because the MTJ elements provides a higher output, compared with conventional anisotropic magnetoresistive (AMR) elements and giant magnetoresistive (GMR) elements.

In particular, magnetic memories, which are solid state memories having no operating parts like semiconductor memories, are more useful than the semiconductor memories because of the following characteristics of their own: the information stored therein is not lost even if electric power is disconnected; the number of repetitive rewrites is infinite, namely, an infinite endurance is provided; there is no risk of destroying the recorded contents even if exposed to radioactive rays, etc.

FIG. 6 shows the constitution of a conventional MTJ element. Such a constitution is disclosed, for example, in JP-A-9-106514.

The MTJ element in FIG. 6 is constituted of the following stacked layers: an antiferromagnetic layer 41, a ferromagnetic layer 42, an insulating layer 43, and a ferromagnetic layer 44. As the material of the antiferromagnetic layer 41, an alloy such as FeMn, NiMn, PtMn or IrMn is used. As the materials of the ferromagnetic layers 42 and 44, Fe, Co, Ni or an alloy thereof is used. Further, as the insulating layer 43, various oxides and nitrides are being studied, and it is known that the highest magnetoresistance (MR) ratio is obtained when using an $Al_2O_3$ film.

In addition to this, there has been proposed an MTJ element without the antiferromagnetic layer 41, which utilizes a difference in coercive force between the ferromagnetic layers 42 and 44.

FIG. 7 shows the principle of operation of the MTJ element having the constitution shown in FIG. 6 where the MTJ element is used for a magnetic memory. The directions in which the ferromagnetic layers are magnetized are indicated by arrows.

The magnetizations of both the ferromagnetic layers 42 and 44 are parallel to the film surface and have effective uniaxial magnetic anisotropy such that the magnetizations of these layers are parallel or antiparallel to each other. The magnetization of the ferromagnetic layer 42 is substantially fixed in one direction by the exchange coupling with the antiferromagnetic layer 41, and a recorded content is represented by the direction of magnetization of the ferromagnetic layer 44.

The resistance of the MTJ element differs depending on whether the magnetization of the ferromagnetic layer 44 to serve as a memory layer is parallel or antiparallel to the direction of magnetization of the ferromagnetic layer 42. Utilizing the difference in resistance, information is read from the MTJ element by detecting its resistance value. On the other hand, information is written to the MTJ element by changing the direction of magnetization in the ferromagnetic layer 44 using a magnetic field generated by electric current lines placed in the vicinity of the MTJ element.

In using the MTJ elements as memory cells in a magnetic memory, it is necessary to reduce influences of thermal noise so as to enable a sense amplifier to perform the sensing. To this end, the MTJ element should have a resistance reduced to some degree. To reduce the resistance of the MTJ element, the insulating film of $Al_2O_3$ must be formed as thin as 1 nm or less.

With such a thin $Al_2O_3$ the MTJ element can have a reduced resistance. However, the magnetoresistance ratio also tends to deteriorate. This may be ascribable mainly to a method of forming the $Al_2O_3$ film. Specifically, in a process of oxidizing a thin Al film of a thickness of 1 nm or less in an oxidizing plasma ambient, because active oxygen is used in the form of ions or radicals, it is difficult to selectively oxidize the thin Al film only. Therefore, if one tries to oxidize the Al film sufficiently, there is a strong possibility that a ferromagnetic layer surface touching the Al barrier layer is also oxidized though partially. To the contrary, if one tries to avoid such oxidation of a ferromagnetic layer, oxidization of the Al film may result insufficient.

In addition, it is very difficult to form a very thin $Al_2O_3$ of 1 nm or less without any pinholes. Existence of pinholes in the $Al_2O_3$ insulating film would cause reduction of yields in an application requiring a multiplicity of MTJ elements such as in a magnetic memory.

SUMMARY OF THE INVENTION

In view of the above problems, it is an object of the present invention to provide a magnetic memory element that has a resistance and a magnetoresistance ratio which meet requirements of a magnetic memory, but yet is free from reduction of yields due to pinholes, and also to provide a magnetic memory using such magnetic memory elements as memory cells.

In order to accomplish the above object, a magnetic memory element according to the present invention comprises:

a first ferromagnetic layer;

a second ferromagnetic layer; and a non-magnetic layer disposed between the first and second ferromagnetic layers, the non-magnetic layer having an electrical characteristic that is changeable depending on an external magnetic field applied to the non-magnetic layer.

According to the present invention, because the non-magnetic layer is not required to be an insulative film, it is possible to reduce the resistance of the magnetic memory element, without deteriorating its characteristics. Furthermore, no film thickness restriction, such as being 1 nm or less, is not imposed upon the non-magnetic layer not of an insulative material such as $Al_2O_3$. Thus, it is possible to form the non-magnetic layer without pinholes.

The non-magnetic layer may be formed of a III–V group compound. As the III–V compound, III–V compound semiconductors such as InSb, InAs, GaAs, InAsP, can be used.

The III–V compound semiconductors generally have a great mobility so that their electrical characteristics are easily changed by the external magnetic fields.

Alternatively, the non-magnetic layer may be constituted of a diode, such as a tunnel diode. Use of a diode for the non-magnetic layer will contribute to the improvement of the characteristics of the magnetic memory element.

As a further alternative, the non-magnetic layer may be formed of a IV group semiconductor, e.g., Si or Ge. In particular, when using Si, there is an advantage that amplifiers and peripheral circuits necessary for a memory are fabricated at the same time.

As a still further alternative, the non-magnetic layer may be formed of a film of MnSb fine particles.

Preferably, the non-magnetic layer may have a thickness of more than 1 nm, but less than 100 nm.

The first and second ferromagnetic layers may have perpendicular magnetizations. Alternatively, they may have horizontal magnetizations.

Use of the magnetic memory element of the present invention enables production of magnetic memories with improved yields.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the magnetic memory element of the invention will be explained with reference to the drawings attached.

Figure 1:
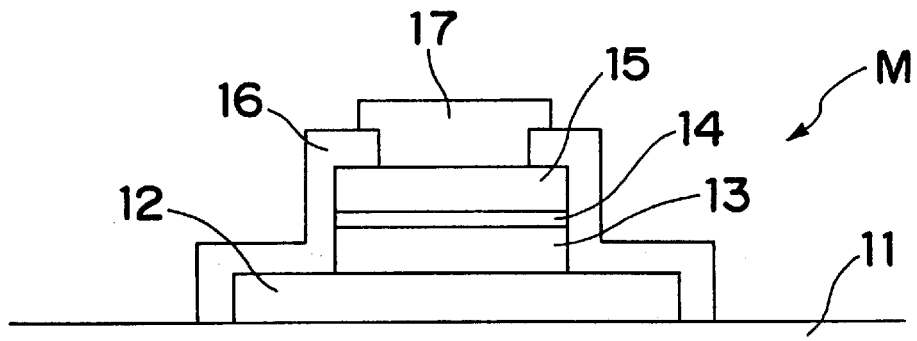
FIG. 1 schematically shows the structure of an embodiment of the magnetic memory element of the present invention.

FIG. 1 shows the constitution of an embodiment of the magnetic memory element according to the present invention. As shown in FIG. 1, in the magnetic memory element, stacked on a substrate 11 are a first wiring layer (lower wiring) 12, a first ferromagnetic layer 13, a non-magnetic layer 14, a second ferromagnetic layer 15, an insulating layer 16, and a second wiring layer (upper wiring) 17. The second wiring layer 17 is disposed on the second ferromagnetic layer 15 via the insulating layer 16. The non-magnetic layer 14 is constituted of a material whose resistance changes depending on an external magnetic field.

The magnetic memory element was fabricated in the following manner.

First, the following films were successively formed on a Si substrate 11 having a thermally oxidized surface in a magnetron sputtering apparatus: a 50-nm thick Al film to serve as the first wiring layer 12, a 20-nm thick Fe film to serve as the first ferromagnetic layer 13, a 20-nm thick InSb film to serve as the non-magnetic layer 14, and a 30-nm thick CoFe film to serve as the second ferromagnetic layer 15. The sputtering conditions were: Ar pressure being 5 mTorr, and a radio-frequency power being 100 W (with the target diameter being 4 inches).

For the comparison purposes, MTJ films were also formed by replacing the InSb film to become the non-magnetic layer 14 with an $Al_2O_3$ film, the latter being formed by first forming a 1-nm thick Al film and then oxidizing the Al film by oxygen plasmas in the same vacuum.

Then, the stacked films were shaped into a pattern of the lower wiring by ordinary photolithography and ion milling technique. Thereafter, a resist pattern for defining the device size was formed on the CoFe film as the second ferromagnetic layer 15, and an ion milling process was performed until the Fe film as the first ferromagnetic layer 13 was reached. Then, with the resist pattern left, a $SiO_2$ film to serve as the insulating film 16 was formed to a thickness of 300 nm with a radio-frequency magnetron sputtering apparatus, and the resist was lifted off.

Next, an 200-nm thick Al film was formed by the radio-frequency magnetron sputtering apparatus and subjected to an ordinary photolithography and reactive ion etching (RIE) to become the second wiring layer (upper wiring) 17. As a result, the magnetic memory element was completed. An MTJ element as a comparative example was also completed through the similar process steps.

The thus formed magnetic memory element and MTJ element were measured. The measurement results have proved that the magnetic memory element using the InSb non-magnetic film 14 has a larger change of magnetic resistance and a lower device resistance than the MTJ element using the $Al_2O_3$ film instead of the InSb film.

Figure 2A:
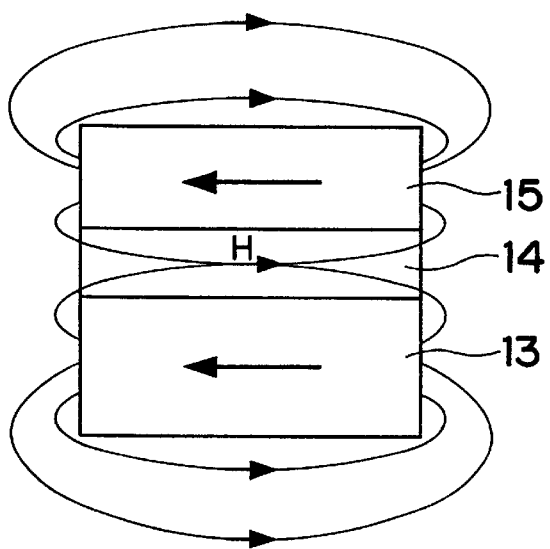
FIGS. 2A and 2B show explanatory views for describing the operational mechanism of the magnetic memory element of the invention.
Figure 2B:
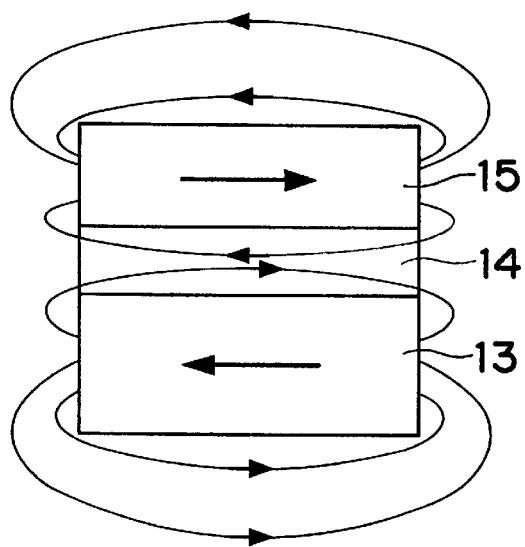

FIGS. 2A and 2B illustrate a mechanism by which the magnetic memory element of this embodiment has functions required when used as a memory cell in a magnetic memory. In FIGS. 2A and 2B, only the first ferromagnetic layer 13, the non-magnetic layer 14 and the second ferromagnetic layer 15 are shown for the sake of simplicity, and arrows indicate directions of magnetization of each ferromagnetic layer and directions of external leakage magnetic fields. FIG. 2A shows that the magnetization of the first ferromagnetic layer 13 is parallel to the magnetization of the second ferromagnetic layer 15, when a magnetic field H, which is a combination of magnetic fields generated by magnetic poles at opposite ends of each ferromagnetic layer, is being applied to the non-magnetic layer 14. On the other hand, FIG. 2B shows that the magnetization of the first ferromagnetic layer 13 is antiparallel to the magnetization of the second ferromagnetic layer 15, when magnetic fields generated by magnetic poles at opposite ends of each ferromagnetic layer are canceled by each other so that practically no magnetic field is applied to the non-magnetic layer 14. Thus, forming the non-magnetic layer 14 of a material whose electrical characteristics vary depending on the magnetic field to be applied to the non-magnetic layer 14 allows us to detect whether the magnetizations of the two ferromagnetic layers are parallel or antiparallel, so that the magnetic memory elements so formed are usable in a magnetic memory.

The fact that the resistance of InSb used in the embodiment is changed by an external magnetic field is reported in, for example, "Z. Phys., Vol. 138 (1954), p. 322, Welker".

As the non-magnetic layer 14, a semiconductor device such as a tunnel diode may be used instead of the material of which the resistance changes by the external magnetic field. That the characteristic of a tunnel diode formed of InSb changes according to an external magnetic field is reported in, for example, a literature "Phys. Rev. Lett., Vol. 5 (1960), p. 55, A. R. Calawa".

Figure 4:
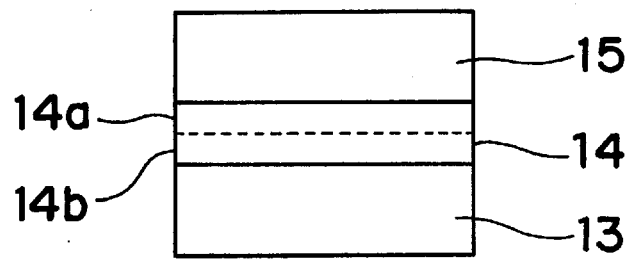
FIG. 4 shows an example of a magnetic memory element in which the non-magnetic layer consists of a diode, showing the non-magnetic layer and the ferromagnetic layers only.

FIG. 4 shows an example in which the non-magnetic layer consists of a diode. In the figure, only the non-magnetic layer and the two ferromagnetic layers 13 and 15 sandwiching the non-magnetic layer therebetween are shown, and an n-type semiconductor and a p-type semiconductor constituting the diode are denoted by 14a and 14b, respectively.

Furthermore, the fact that a thin film formed of fine particles of MnSb forms a superparamagnet and exhibits a large resistance change in response to external magnetic fields applied, is known from "Appl. Phys. Lett., Vol. 76 (2000), p. 357, H. Akinaga". Such a film, which has the artificial structure, may also be used as the non-magnetic layer 14.

In the above embodiment shown in FIG. 1, a Fe film is used as the first ferromagnetic layer 13 and a CoFe film is used as the second ferromagnetic layer 15. The materials of the first and second ferromagnetic layer 13 are not limited to the above example and may be suitably selected from a group consisting of Fe, Co, Ni, and alloys of two or three of these metals.

The ferromagnetic layers 13, 15 preferably have a thickness of larger than 1 nm, but less than 100 nm, for the following reasons. If the thickness of a ferromagnetic layer is too small, a thermal energy would cause the ferromagnetic layer to be superparamagnetic. This is why it is desirable that the ferromagnetic layers 13, 15 have a thickness of more than 1 nm. On the other hand, if the thickness is too large, the influence of the end-portion magnetic poles will increase. This is why it is desirable that the ferromagnetic layers 13, 15 have a thickness of less than 100 nm. Each ferromagnetic layer may be formed of a multi-layer film. In this case, films constituting the multi-layer film are formed such that they have a total thickness of more than 1 nm, but less than 100 nm.

Regarding the thickness of the non-magnetic layer 14, there is no restriction upon it unlike the case of the $Al_2O_3$ film of the MTJ element (in which case the thickness of the $Al_2O_3$ film must be 1 nm or less). The thickness of the non-magnetic layer 14 will be suitably determined depending upon the balance between the resistance of the material or semiconductor device and its sensitivity to the magnetic field.

Figure 3A:
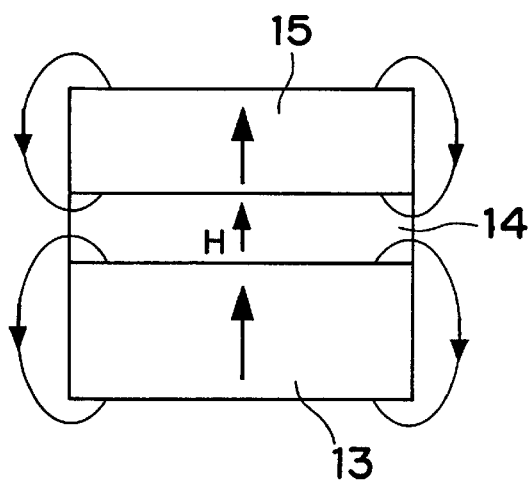
FIGS. 3A and 3B schematically show another structure of the magnetic memory element of the present invention in which perpendicular magnetization is used.
Figure 3B:
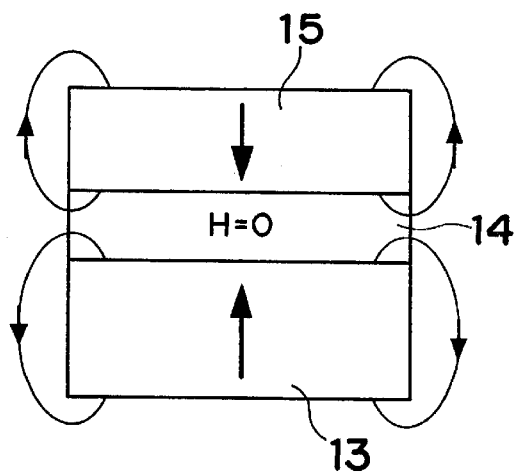
Figure 6:
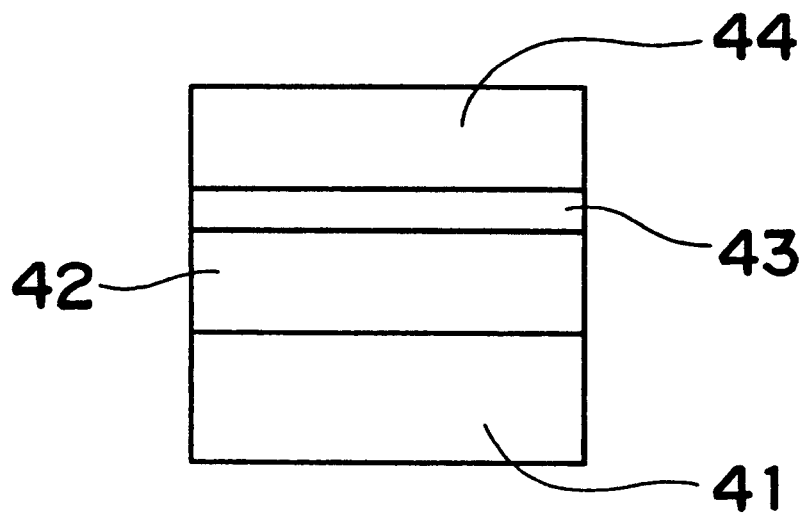
FIG. 6 shows the structure of a conventional MTJ element.
Figure 7:
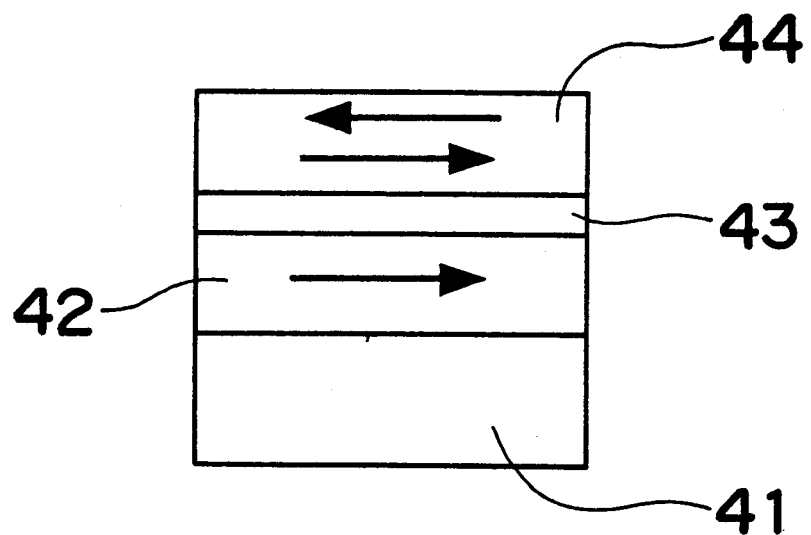
FIG. 7 shows the principle of operation of the conventional MTJ element when used in a magnetic memory.

In the above embodiment, the magnetization of each ferromagnetic layer is oriented parallel to the layer surface, as shown in FIGS. 2A and 2B. Alternatively, the magnetization of each ferromagnetic layer may be oriented perpendicular to the layer surface, as shown in FIGS. 3A and 3B, which show how the magnetic fields are applied to the non-magnetic layer 14. Specifically, FIG. 3A shows that the perpendicular magnetization of the first ferromagnetic layer 13 is oriented to the same direction as the perpendicular magnetization of the second ferromagnetic layer 15, when a resultant magnetic field H, which is a combination of magnetic fields generated by magnetic poles at opposite ends of each ferromagnetic layer, is being applied to the non-magnetic layer 14. On the other hand, FIG. 3B shows that the perpendicular magnetization of the first ferromagnetic layer 13 is reverse to the magnetization of the second ferromagnetic layer 15, when magnetic fields generated by magnetic poles at opposite ends of each ferromagnetic layer are canceled by each other so that practically no magnetic field is applied to the non-magnetic layer 14. Because the non-magnetic layer 14 is formed of a material whose electrical characteristics vary depending on the magnetic field to be applied to the non-magnetic layer 14, it is possible to detect whether the magnetizations of the two ferromagnetic layers are parallel or antiparallel, so that the magnetic memory elements so formed are usable in a magnetic memory.

In the above, the non-magnetic layer 14 has been described as being formed of the III–V group metal compound of InSb or the tunnel diode. However, it would be obvious to those skilled in the art that the non-magnetic layer 14 is not limited to such a structure, but may have any structure as far as the structure allows the non-magnetic layer 14 to change in its electrical characteristic, such as resistance, I–V characteristic, or the like, depending on the external magnetic field that is to be applied to the non-magnetic layer 14 when a current is applied in a direction across the first and second ferromagnetic layers 13 and 15. For example, as the material of the non-magnetic layer 14, III–V semiconductor compounds other than InSb, e.g., InAs, GaAs, or InAsP, can be used. Also, IV group semiconductor such as Si or Ge is also usable. In addition, the above-mentioned superparamagnetic formed of MnSb fine particles may also be used.

In the shown embodiments, the non-magnetic layer 14 is shown electrically connected directly to the first and second ferromagnetic layers 13 and 15. However, in order to prevent a disadvantage such as mutual diffusion between the non-magnetic layer 14 and the first and second ferromagnetic layers 13, 15, a protection layer may be interposed between the non-magnetic layer 14 and the first and/or second ferromagnetic layer 13, 15. Thus, the magnetic memory element of the invention has a higher design freedom, as compared with the MTJ element.

Note that in applying the magnetic memory element to a magnetic memory, it is necessary to take measures for fixing the magnetization direction of one of the two ferromagnetic layers by, for example, providing an antiferromagnetic layer (not shown) to be exchange-coupled with the associated ferromagnetic layer, as is well known to those skilled in the art.

Figure 5:
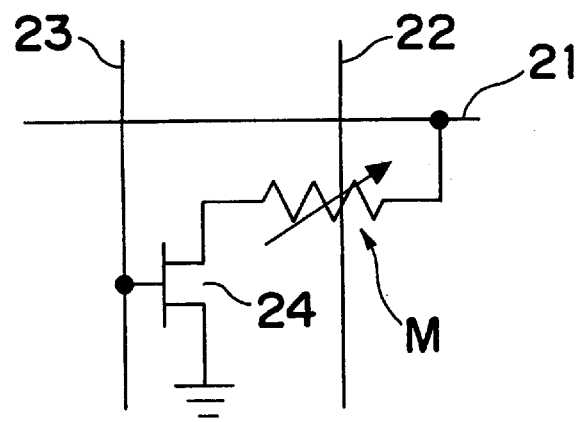
FIG. 5 shows an essential part of a magnetic memory in which the magnetic memory element of the invention is used as a memory cell.

FIG. 5 shows an essential part of a magnetic random access memory using the above-described magnetic memory element as a memory cell. Although the memory actually has a multiplicity of magnetic memory elements, only one of them is shown. In FIG. 5, the magnetic memory element, denoted by M, is shown in the form of a variable resistor. Reference numeral 21 denotes a bit line, reference numeral 22 a word line, reference numeral 23 a sense line, and reference numeral 24 a MOS-FET as a switching element connected across the magnetic memory element M and the sense line 23. In the read operation, a magnetic memory element M is selected by using the associated sense line 23, bit line 21 and MOS-FET 24. Data is read by detecting the resistance value difference. On the other hand, in the write operation, the orientation of magnetization of a selected magnetic memory element M is changed according to data by the resultant magnetic field generated from the associated word line 22 and bit line 21. Data is written to the selected magnetic memory in this way.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-terminal magnetic memory element comprising:
   a substrate;
   a first ferromagnetic layer;
   a second ferromagnetic layer;
   a non-magnetic layer disposed between said first and second ferromagnetic layers, said non-magnetic layer having an electrical characteristic that is changeable depending on an external magnetic field applied to said non-magnetic layer;
   a first wiring layer provided between said substrate and said first ferromagnetic layer; and
   a second wiring layer provided on said second ferromagnetic layer.

2. The magnetic memory element according to claim 1, wherein said non-magnetic layer is formed of a III–V group compound.

3. The magnetic memory element according to claim 2, wherein said III–V group compound is selected from a group consisting of InSb, InAs, GaAs, or InAsP.

4. The magnetic memory element according to claim 1, wherein said non-magnetic layer is constituted of a diode.

5. The magnetic memory element according to claim 1, wherein said non-magnetic layer is constituted of a IV group semiconductor.

6. The magnetic memory element according to claim 5, wherein said IV group semiconductor is one of Si or Ge.

7. The magnetic memory element according to claim 1, wherein said non-magnetic layer is constituted of a film of MnSb fine particles.

8. The magnetic memory element according to claim 1, wherein said first and second ferromagnetic layers have perpendicular magnetizations.

9. The magnetic memory element according to claim 1, wherein said first and second ferromagnetic layers have thicknesses of more than 1 nm, but less than 100 nm.

10. A magnetic memory using the magnetic memory element according to claim 1 as a memory cell.

* * * * *